United States Patent
Fujikura

(10) Patent No.: US 11,225,208 B2
(45) Date of Patent: Jan. 18, 2022

(54) WIRE HARNESS

(71) Applicant: SUMITOMO WIRING SYSTEMS, LTD., Yokkaichi (JP)

(72) Inventor: Masaya Fujikura, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 17/061,907

(22) Filed: Oct. 2, 2020

(65) Prior Publication Data

US 2021/0122308 A1    Apr. 29, 2021

(30) Foreign Application Priority Data

Oct. 23, 2019 (JP) .............................. JP2019-192736

(51) Int. Cl.
| | |
|---|---|
| *B60R 16/02* | (2006.01) |
| *B62D 27/02* | (2006.01) |
| *H05K 9/00* | (2006.01) |
| *H02G 3/22* | (2006.01) |
| *H02G 3/04* | (2006.01) |

(52) U.S. Cl.
CPC ...... *B60R 16/0222* (2013.01); *B60R 16/0207* (2013.01); *B60R 16/0215* (2013.01); *B62D 27/02* (2013.01); *H02G 3/22* (2013.01); *H05K 9/0098* (2013.01); *H02G 3/04* (2013.01)

(58) Field of Classification Search
CPC ... H02G 3/04; H02G 3/20; H02G 3/22; B60R 16/02; B60R 16/0207; B60R 16/0215; B60R 16/0222
See application file for complete search history.

(56) References Cited

U.S. PATENT DOCUMENTS

| | | | |
|---|---|---|---|
| 6,054,649 A * | 4/2000 | Uchida .................. | H01B 11/16 174/36 |
| 9,345,179 B2 | 5/2016 | Imahori et al. | |
| 2008/0009175 A1* | 1/2008 | Kamenoue ......... | B60R 16/0222 439/397 |
| 2012/0325521 A1* | 12/2012 | Suzuki ................ | B60R 16/0222 174/153 G |
| 2013/0342300 A1* | 12/2013 | Nagata .................... | H01F 41/00 336/175 |
| 2014/0182921 A1* | 7/2014 | Imahori .................. | H01F 17/06 174/350 |
| 2017/0118878 A1* | 4/2017 | Kimoto ................ | H05K 9/0081 |
| 2018/0233263 A1* | 8/2018 | Mizutani ................ | H01F 17/06 |
| 2018/0247758 A1* | 8/2018 | Oka ........................ | H01F 17/06 |

* cited by examiner

*Primary Examiner* — Paresh H Paghadal
(74) *Attorney, Agent, or Firm* — Oliff PLC

(57) ABSTRACT

A wire harness including: a wire; an electromagnetic wave absorber that has a through hole through which the wire passes, and that is provided so as to surround an outer circumference of the wire; and a movement restrictor that is provided adjacent to the electromagnetic wave absorber, and that restricts movement of the electromagnetic wave absorber in a length direction of the wire.

7 Claims, 5 Drawing Sheets

WIRE HARNESS

BACKGROUND

The present disclosure relates to a wire harness.

Conventionally, as a wire harness mounted in vehicles such as a hybrid vehicle and an electric automobile, a wire harness is known that includes a wire that electrically connects a plurality of electric devices to each other, and an electromagnetic wave absorption member that absorbs the electromagnetic waves (electromagnetic noise) emitted from the wire. In a wire harness of this kind, the wire is passed through a through hole of an electromagnetic wave absorption member such as a ferrite core, whereby the electromagnetic wave absorption member is provided on the outer circumference of the wire (see, e.g. JP 2014-130886A). The electromagnetic wave absorption member is fixed to the wire by a tape member.

SUMMARY

However, the above-described wire harness suffers from the problem that the electromagnetic wave absorption member is positionally displaced relative to the wire until the electromagnetic wave absorption member is fixed to the wire by the tape member.

An exemplary aspect of the disclosure provides a wire harness that can suppress positional displacement of an electromagnetic wave absorption member.

A wire harness according to the present disclosure includes: a wire; an electromagnetic wave absorber that has a through hole through which the wire passes, and that is provided so as to surround an outer circumference of the wire; and a movement restrictor that is provided adjacent to the electromagnetic wave absorber, and that restricts movement of the electromagnetic wave absorber in a length direction of the wire.

With the wire harness according to the present disclosure, it is possible to achieve the effect of suppressing positional displacement of the electromagnetic wave absorber.

DETAILED DESCRIPTION OF EMBODIMENTS

Figure 1:
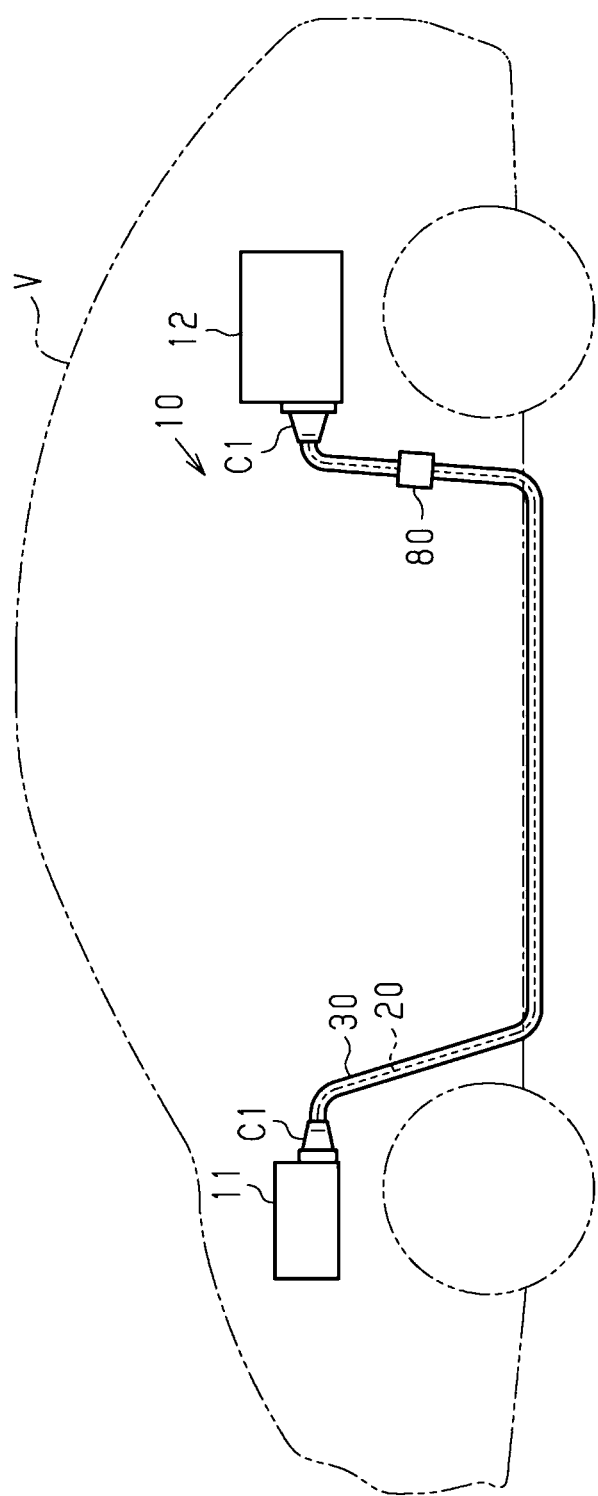
FIG. 1 is a schematic configuration diagram showing a wire harness according to an embodiment.

Description of Embodiments of the Present Disclosure

First, embodiments of the present disclosure will be listed and described.

[1] A wire harness according to the present disclosure includes: a wire; an electromagnetic wave absorption member that has a through hole through which the wire passes, and that is provided so as to surround an outer circumference of the wire; and a movement restriction member that is provided adjacent to the electromagnetic wave absorption member, and that restricts movement of the electromagnetic wave absorption member in a length direction of the wire.

With this configuration, the movement restriction member is provided adjacent to the electromagnetic wave absorption member. With the movement restriction member, it is possible to suppress positional displacement of the electromagnetic wave absorption member in the length direction of the wire.

[2] Preferably, the movement restriction member is provided on only one side of the electromagnetic wave absorption member in the length direction of the wire.

With this configuration, when attaching the electromagnetic wave absorption member to the wire, for example, it is possible to restrict movement of the electromagnetic wave absorption member in the length direction of the wire by the movement restriction member. Accordingly, it is possible to easily position the electromagnetic wave absorption member in the length direction of the wire.

This can increase the ease of assembly of the wire harness.

[3] Preferably, the above-described wire harness further includes a covering member that covers the outer circumference of the wire, wherein the covering member passes through the through hole in a state in which the covering member covers the outer circumference of the wire.

With this configuration, the wire is passed through the through hole of the electromagnetic wave absorption member in a state in which the wire is covered by the covering member. Accordingly, it is possible to prevent the inner circumferential surface of the through hole from coming into direct contact with the outer circumferential surface of the wire. This can suitably prevent the wire from being damaged due to contact with the inner circumferential surface of the through hole.

[4] Preferably, the covering member is formed in a sheet shape having a slit extending along the length direction of the wire, the covering member includes a first end in a first direction intersecting the length direction of the wire, and a second end provided opposite to the first end in the first direction, the covering member is formed so as to have a tubular shape that surrounds the outer circumference of the wire throughout a circumferential direction thereof by overlapping the second end with the first end, and the movement restriction member is provided so as to surround an outer circumference of the covering member throughout a circumferential direction thereof.

With this configuration, the covering member can be formed so as to have a tubular shape that surrounds the outer circumference of the wire throughout the circumferential direction thereof by overlapping the second end of the sheet-shaped covering member with the first end thereof. Accordingly, the covering member can be easily attached to the wire at a later time. This can increase the ease of assembly of the wire harness.

Also, by forming the movement restriction member so as to surround the outer circumference of the covering member throughout the circumferential direction thereof, it is possible to maintain the tube state of the covering member by the movement restriction member. This can suppress an increase in the number of components as compared with a case where the member for restricting movement of the electromagnetic wave absorption member and the member for maintaining the tube state of the covering member are provided separately.

[5] Preferably, the above-described wire harness further includes a tape member that fixes the electromagnetic wave absorption member to the covering member, wherein the tape member covers an outer circumferential surface of the electromagnetic wave absorption member, and covers the outer circumference of the covering member throughout the circumferential direction.

With this configuration, it is possible to fix the electromagnetic wave absorption member to the covering member by the tape member. This can suitably suppress positional displacement of the electromagnetic wave absorption member relative to the covering member. Also, by forming the tape member so as to cover the outer circumference of the covering member throughout the circumferential direction, it is possible to maintain the tube state of the covering member by the tape member. This can suppress an increase in the number of components as compared with a case where the member for fixing the electromagnetic wave absorption member to the covering member and the member for maintaining the tube state of the covering member are provided separately.

[6] Preferably, the movement restriction member is a cable tie including a band-shaped portion, and a lock portion that is formed as a single piece with the band-shaped portion at a proximal end of the band-shaped portion in a length direction thereof, and the lock portion opposes a side surface of the electromagnetic wave absorption member.

With this configuration, it is possible to restrict movement of the electromagnetic wave absorption member in the length direction of the wire by bringing the side surface of the electromagnetic wave absorption member into contact with the lock portion of the cable tie. In addition, with the cable tie, the band-shaped portion can be easily wrapped around the outer circumferences of the wire, thus making it possible to increase the ease of assembly of the wire harness.

[7] Preferably, a distal end of the band-shaped portion in the length direction protrudes outward from the lock portion, and the distal end opposes the side surface of the electromagnetic wave absorption member.

With this configuration, the distal end of the band-shaped portion is formed so as to protrude outward from the lock portion. Thus, the outer circumferential dimension of the movement restriction member can be formed to be large. Accordingly, it is possible to suitably prevent the movement restriction member from being passed through the through hole of the electromagnetic wave absorption member. As a result, it is possible to suitably restrict movement of the electromagnetic wave absorption member by the movement restriction member.

[8] Preferably, the above-described wire harness further includes: a grommet that is to be attached to a mounting hole of a vehicle body panel provided between a waterproof region that requires waterproofing and a non-waterproof region that does not require waterproofing; and a connector that is connected to an end of the wire, wherein the connector is provided in the non-waterproof region, the electromagnetic wave absorption member is provided between the grommet and the connector in the length direction of the wire, and the movement restriction member is provided between the grommet and the electromagnetic wave absorption member in the length direction of the wire.

With this configuration, the electromagnetic wave absorption member is disposed in the non-waterproof region. Therefore, the electromagnetic wave absorption member and the surrounding region do not need to have a waterproof structure. Accordingly, any additional member for forming a waterproof structure does not need to be provided, thus making it possible to suppress an increase in the number of components.

[9] Preferably, the above-described wire harness further includes a vehicle body fixing clamp provided between the connector and the electromagnetic wave absorption member in the length direction of the wire. With this configuration, in the length direction of the wire, the grommet that is to be attached to the vehicle body panel is provided on one side of the electromagnetic wave absorption member, and the clamp that is to be fixed to the vehicle body is provided on the other side of the electromagnetic wave absorption member. Accordingly, both sides of the electromagnetic wave absorption member can be fixed to the vehicle body. This makes it possible to stably hold the electromagnetic wave absorption member.

[10] Preferably, the above-described wire harness further includes a porous dampening member that covers an outer circumference of the electromagnetic wave absorption member. With this configuration, the outer circumference of the electromagnetic wave absorption member is covered by the porous dampening member, and therefore the dampening member can be interposed between the electromagnetic wave absorption member and the surrounding components. This can prevent the electromagnetic wave absorption member and the surrounding components from coming into direct contact with each other, thus making it possible to inhibit the generation of unusual sound due to contact between the electromagnetic wave absorption member and the surrounding components.

[11] Preferably, the dampening member is provided so as to cover the outer circumference of the movement restriction member. With this configuration, the outer circumference of the movement restriction member is covered by the porous dampening member, and therefore the dampening member can be interposed between the movement restriction member and the surrounding components. This can inhibit the generation of unusual sound due to contact between the movement restriction member and the surrounding components.

DETAILS OF EMBODIMENTS OF THE PRESENT DISCLOSURE

Specific examples of the wire harness according to the present disclosure will be described below with reference to the drawings. In the drawings, parts of configurations are shown exaggerated or simplified in some cases for convenience of description. Also, dimensional proportions of the portions may be different from the actual dimensional proportions in the drawings. It should be noted that the present disclosure is not limited to these examples, and is intended to include all modifications which fall within the scope of the claims and the meaning and scope of equivalents thereof.

Overall Configuration of Wire Harness 10

The wire harness 10 shown in FIG. 1 electrically connects two, or three or more electric devices (devices). The wire harness 10 electrically connects, for example, an inverter 11 installed at the front of a vehicle V such as a hybrid vehicle or an electric automobile to a high-voltage battery 12 installed in the vehicle at a location rearward of the inverter 11. The wire harness 10 is routed so as to pass under the floor or the like of the vehicle V, for example. For example, an intermediate portion of the wire harness 10 in the length direction is routed so as to pass through the vehicle exterior, such as under the floor or the like of the vehicle V. The inverter 11 is connected to a wheel driving motor (not shown) serving as a traveling power source of the vehicle.

The inverter 11 generates alternating-current power from the direct-current power of the high-voltage battery 12, and supplies the alternating-current power to the motor. The high-voltage battery 12 is a battery capable of supplying a voltage of several hundreds of volts, for example.

The wire harness 10 includes, for example, one or more (two in the present embodiment) wires 20, a pair of connectors C1 attached to opposite ends of the wires 20, and an exterior member 30 that collectively surrounds the plurality of wires 20, and an electromagnetic wave absorption member 80 (electromagnetic wave absorber).

Configuration of Wire 20

One end of each wire 20 is connected to the inverter 11 via one connector C1, and the other end of the wire 20 is connected to the high-voltage battery 12 via the other connector C1. Each wire 20 is formed in an elongated shape extending in the front-rear direction of the vehicle V, for example. Each wire 20 is formed so as to be two-dimensionally or three-dimensionally bendable according to the routing path of the wire harness 10, for example. Each wire 20 is a high-voltage wire capable of accommodating a high-voltage and a large current, for example. For example, each wire 20 may be a shielded wire having an electromagnetic shielding structure therein, or may be a non-shielded wire having no electromagnetic shielding structure therein. Each of the wires 20 of the present embodiment is a non-shielded wire.

Figure 2:
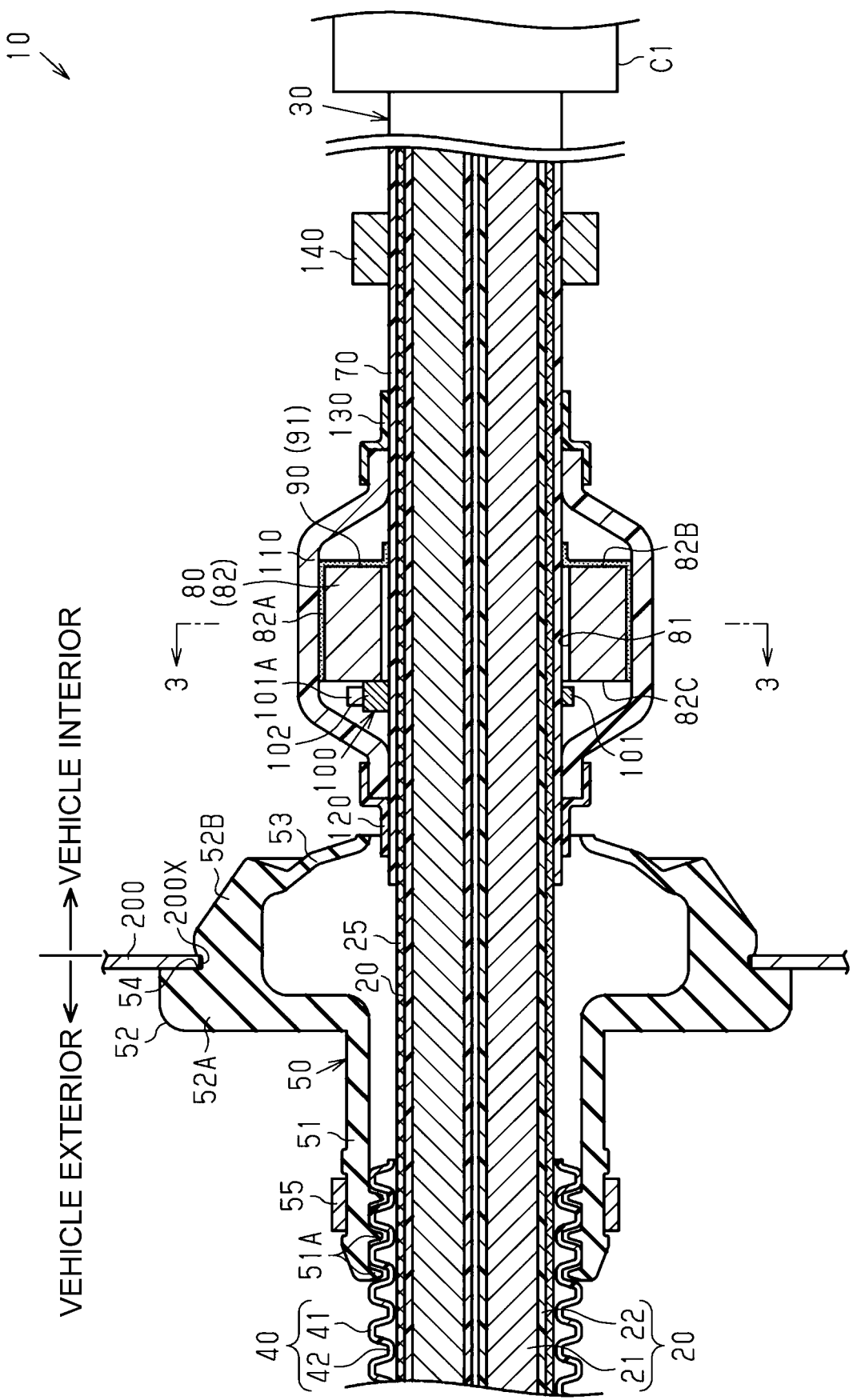
FIG. 2 is a schematic cross-sectional view of the wire harness according to an embodiment.

As shown in FIG. 2, each wire 20 is a covered wire including a core wire 21 made of a conductor, and an insulating covering 22 that covers the outer circumference of the core wire 21. As the core wire 21, it is possible to use, for example, a stranded wire formed by twisting a plurality of metal strands together, a columnar conductor formed by a single columnar metal bar having a solid internal structure, a tubular conductor having a hollow internal structure, or the like. As the core wire 21, it is also possible to use, for example, a combination of a stranded wire, a columnar conductor, and a tubular conductor. Examples of the columnar conductor include a single-core wire and a bus bar. The core wire 21 of the present embodiment is a stranded wire. As the material of the core wire 21, it is possible to use a copper-based or aluminum-based metal material, for example.

Configuration of Core Wire 21

The cross-sectional shape (i.e., transverse cross-sectional shape) of the core wire 21 taken along a plane orthogonal to the length direction of the core wire 21 can be formed in any shape. The transverse cross-sectional shape of the core wire 21 can be formed in a circular shape, a semicircular shape, a polygonal shape, a square shape, or a flat shape, for example. The transverse cross-sectional shape of the core wire 21 of the present embodiment is formed in a circular shape.

Configuration of Insulating Covering 22

The insulating covering 22 covers the outer circumferential surface of the core wire 21 throughout the circumferential direction thereof, for example. For example, the insulating covering 22 is formed of an insulating material such as a synthetic resin. As the material of the insulating covering 22, it is possible to use, for example, a synthetic resin composed mainly of a polyolefin-based resin such as a crosslinked polyethylene or a cross-linked polypropylene. As the material of the insulating covering 22, it is possible to use one material alone, or two or more materials in an appropriate combination. The insulating covering 22 can be formed by performing extrusion molding (extrusion coating) on the core wire 21, for example.

Configuration of Electromagnetic Shielding Member 25

For example, the wire harness 10 includes an electromagnetic shielding member 25 that collectively surrounds the outer circumferences of the plurality of wires 20. For example, the electromagnetic shielding member 25 as a whole has a tubular shape that collectively surrounds the outer circumferences of the plurality of wires 20. For example, the electromagnetic shielding member 25 is provided in an internal space of the exterior member 30 so as to surround the outer circumferences of the plurality of wires 20 throughout the circumferential direction thereof. The electromagnetic shielding member 25 is provided so as to surround the outer circumferences of the wires 20 along substantially the entire length of the wires 20 in the length direction thereof.

In the following description, when a direction is simply referred to as "length direction", it means the direction in which the central axis of the wires 20 extends. When a direction is simply referred to as "circumferential direction", it means the circumferential direction of the central axis of the wires 20. Also, in the following description, when a direction is simply referred to as "radial direction", it means the radial direction of the central axis of the wires 20.

As the electromagnetic shielding member 25, it is possible to use, for example, a flexible braided wire or metal foil. As the braided wire, it is possible to use a braided wire formed by braiding a plurality of metal strands, or a braided wire formed by braiding metal strands and resin strands in combination. As the material of the metal strands, it is possible to use a copper-based or aluminum-based metal material, for example. As the resin strands, it is possible to use reinforced fibers having excellent insulation and shear resistance, such as para-aramid fibers. Although not shown, opposite ends of the electromagnetic shielding member 25 are connected to ground (grounded) at the connectors C1 or the like.

Configuration of Exterior Member 30

The exterior member 30 shown in FIG. 1 as a whole has an elongated tubular shape. The plurality of wires 20 are passed through the internal space of the exterior member 30. For example, the exterior member 30 is formed so as to surround the entire outer circumferences of the plurality of wires 20. The exterior member 30 protects the wires 20 from flying objects and water droplets, for example. As the exterior member 30, it is possible to use, for example, a pipe made of a metal or a resin, a protector made of a resin, a flexible corrugated tube made of a resin, a waterproofing cover made of a rubber, or a combination thereof. As the material of the pipe made of a metal, it is possible to use a copper-based or aluminum-based metal material, for example. As the material of the protector and corrugated tube made of a resin, it is possible to use, for example, a conductive resin material or a non-conductive resin material. As the resin material, it is possible to use, for example, a synthetic resin such as polyolefin, polyamide, polyester, and an ABS resin.

As shown in FIG. 2, the exterior member 30 includes a corrugated tube 40, a grommet 50, and a covering member 70 (cover).

Configuration of Corrugated Tube 40

For example, the corrugated tube 40 as a whole has a tubular shape that collectively surrounds the outer circumferences of the plurality of wires 20. For example, the corrugated tube 40 is provided so as to surround the outer circumferences of the plurality of wires 20 throughout the circumferential direction thereof. For example, the corrugated tube 40 is provided so as to surround the outer circumference of the electromagnetic shielding member 25 throughout the circumferential direction thereof. For example, the corrugated tube 40 is provided so as to surround a portion of the plurality of wires 20 in the length direction thereof.

The corrugated tube 40 has a bellows structure in which ring-shaped protrusions 41 and ring-shaped recesses 42 are alternately provided successively in the length direction thereof. The corrugated tube 40 is superior in flexibility to the core wire 21. The corrugated tube 40 of the present embodiment is formed in a cylindrical shape. A non-conductive resin material can be used as the material of the corrugated tube 40 of the present embodiment. As the resin material, it is possible to use, for example, a synthetic resin such as polyolefin, polyamide, polyester, and an ABS resin.

Configuration of Grommet 50

For example, the grommet 50 as a whole has a tubular shape that collectively surrounds the outer circumferences of the plurality of wires 20. The grommet 50 as a whole is formed in a cylindrical shape, for example. The grommet 50 is attached to a mounting hole 200X formed in a vehicle body panel 200, for example. That is, the grommet 50 is fixed to the vehicle body panel 200. Here, the vehicle body panel 200 is located between a waterproof region (e.g., the vehicle exterior) that requires waterproofing and a non-waterproof region (e.g., the vehicle interior) that does not require waterproofing, for example. That is, the vehicle body panel 200 is provided so as to separate between the vehicle exterior, which is the waterproof region, and the vehicle interior, which is the non-waterproof region. The mounting hole 200X is formed so as to extend through the vehicle body panel 200 in the thickness direction thereof, and is formed to allow the plurality of wires 20 to pass therethrough.

As the material of the grommet 50, it is possible to use, for example, an elastic material having a relatively high hardness. As the elastic material, it is possible to use, for example, a rubber such as an ethylene-propylene-diene rubber, or an elastomer. The grommet 50 has the function of providing waterproofing in the mounting hole 200X so as to prevent entry of water from the vehicle exterior side, which is the waterproof region, to the vehicle interior side, which is the non-waterproof region, and the function of fixing the plurality of wires 20 to the mounting hole 200X.

For example, the grommet 50 includes a tube portion 51, a flange portion 52 coupled to an end of the tube portion 51, and a tube portion 53 coupled to an end of the flange portion 52 that is located opposite to the end thereof coupled to the tube portion 51. The flange portion 52 is formed projecting radially outward of the other portions, that is, the outer circumferences of the tube portions 51 and 53. For example, the flange portion 52 is formed so as to protrude radially outward of the tube portions 51 and 53 throughout the entire circumferential direction of the tube portions 51 and 53. That is, the outer diameter of the flange portion 52 is formed to be larger than the outer diameters of the tube portions 51 and 53. The grommet 50 is a single component obtained by successively forming the tube portion 51, the flange portion 52, and the tube portion 53 into a single piece, for example.

In a state in which the grommet 50 is attached to the mounting hole 200X of the vehicle body panel 200, the flange portion 52 is fitted to the mounting hole 200X, the tube portion 51 is disposed in the vehicle exterior, and the tube portion 53 is disposed in the vehicle interior. The tube portion 51 is fitted to the outer circumference of an end of the corrugated tube 40, for example. For example, the tube portion 51 is formed in a tubular shape having a size that enables the tube portion 51 to be fitted to the outer circumference of the corrugated tube 40. The tube portion 51 of the present embodiment is formed in a cylindrical shape. One or more (here, three) lips 51A to be locked to the corrugated tube 40 are formed on the inner circumferential surface of an end of the tube portion 51. For example, each lip 51A is formed continuously over the entire inner circumferential surface of the tube portion 51, and is formed in a closed ring shape. For example, each lip 51A is formed so as to enter a ring-shaped recess 42 of the corrugated tube 40 when the tube portion 51 is fitted to the outer circumference of that corrugated tube 40.

For example, a coupling member 55 is provided on the outer circumferential surface of the tube portion 51. As the coupling member 55, it is possible to use, for example, a cable tie or crimping ring made of a resin or a metal. The tube portion 51 is fixed to the corrugated tube 40 by the outer circumference side thereof being fastened by the coupling member 55. Specifically, the tube portion 51 is fastened by the coupling member 55 from the outer circumference side until the tube portion 51 adheres to the corrugated tube 40 in a liquid-tight manner. This can suppress entry of water to the inside of the grommet 50 from between the tube portion 51 and the corrugated tube 40.

In a state in which the end of the tube portion 51 is fitted to the outer circumference of the end of the corrugated tube 40, the internal space of the grommet 50 and the internal space of the corrugated tube 40 communicate with each other, thus forming a path through which the plurality of wires 20 can pass. Note that the internal space of the grommet 50 is formed by the internal space of the tube portion 51, the internal space of the flange portion 52, and the internal space of the tube portion 53 communicating with each other.

The flange portion 52 is configured to elastically adhere to the vehicle body panel 200 in a state in which the grommet 50 is attached to the mounting hole 200X, for example. For example, the flange portion 52 as a whole has a ring disk shape conforming to the mounting hole 200X. The flange portion 52 includes an outer flange 52A coupled to the tube portion 51, and an inner flange 52B coupled to the tube portion 53. In a state in which the grommet 50 is attached to the mounting hole 200X, the outer flange 52A is disposed in the vehicle exterior, and the inner flange 52B is disposed in the vehicle interior.

A groove portion 54 that constitutes a peripheral edge of the mounting hole 200X and into which the vehicle body panel 200 is fitted is provided between the outer flange 52A and the inner flange 52B. In a state in which the vehicle body panel 200 is fitted into the groove portion 54, the outer flange 52A adheres to the surface of the vehicle body panel 200 that faces the vehicle exterior, and the inner flange 52B adheres to the surface of the vehicle body panel 200 that faces the vehicle interior. Consequently, the vehicle body panel 200 is elastically sandwiched between the outer flange 52A and the inner flange 52B. Accordingly, when the vehicle body panel 200 is fitted into the groove portion 54, the movement of the grommet 50 in the axial direction is restricted.

The tube portion 53 is coupled to the inner flange 52B, for example. For example, the tube portion 53 is formed in a tubular shape having a size that allows the plurality of wires 20 to pass therethrough. The tube portion 53 of the present embodiment is formed in a cylindrical shape. The tube portion 53 is fixed to the plurality of wires 20 with a tape (not shown), for example.

For example, the plurality of wires 20 and the electromagnetic shielding member 25 are formed so as to extend from the vehicle exterior, which is the waterproof region, to the vehicle interior, which is the non-waterproof region, through the internal space of the grommet 50. In the vehicle interior, the plurality of wires 20 and the electromagnetic shielding member 25 are drawn out from an end of the tube portion 53 that is located opposite to an end thereof that is connected to the flange portion 52, for example. The wires 20 and the electromagnetic shielding member 25 that have been drawn out from the tube portion 53 are formed so as to extend toward the connector C1 in the vehicle interior.

Configuration of Covering Member 70

For example, the covering member 70 is provided so as to surround the outer circumferences of the plurality of wires 20 that have been drawn out from the tube portion 53 to the connector C1 side. For example, the covering member 70 is provided so as to surround the outer circumferences of the plurality of wires 20 that are exposed from the grommet 50 in the vehicle interior. For example, the covering member 70 as a whole has a tubular shape that collectively surrounds the outer circumferences of the plurality of wires 20. For example, the covering member 70 is provided so as to surround the outer circumferences of the plurality of wires 20 throughout the circumferential direction. For example, the covering member 70 has a tubular shape whose opposite ends in the length direction of the wires 20 are open. For example, the covering member 70 is provided so as to surround the outer circumference of the electromagnetic shielding member 25 that is exposed from the grommet 50 in the vehicle interior. For example, the covering member 70 is provided so as to surround the outer circumference of the electromagnetic shielding member 25 throughout the circumferential direction. For example, the covering member 70 is provided so as to surround a portion of the plurality of wires 20 in the length direction.

For example, one end of the covering member 70 in the length direction thereof is accommodated in the internal space of the grommet 50. That is, the outer circumference of one end of the covering member 70 is surrounded by the grommet 50. In other words, an end of the covering member 70 and an end of the tube portion 53 of the grommet 50 are provided so as to overlap each other in the radial direction of the wires 20. For example, the outer circumferential dimension of the covering member 70 is set to be smaller than the inner circumferential dimension of the tube portion 53. For example, the outer circumferential dimension of the covering member 70 is set to be smaller than the outer circumferential dimension of the corrugated tube 40.

Figure 3:
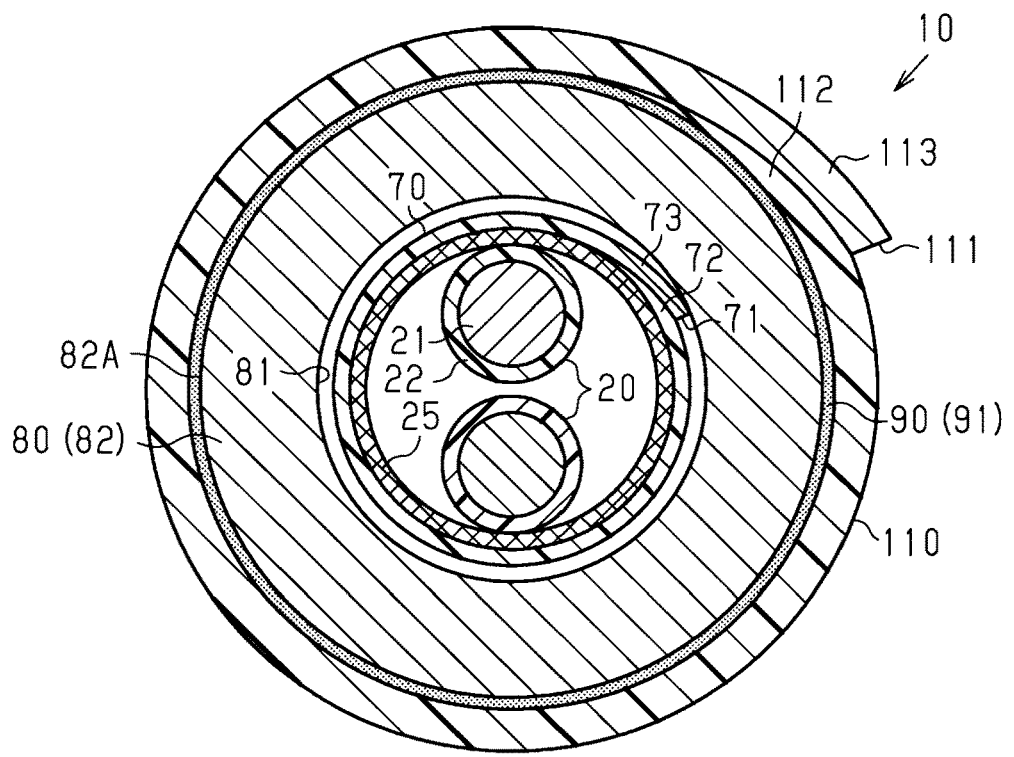
FIG. 3 is a schematic transverse sectional view (cross-sectional view taken along the arrows 3-3 in FIG. 2) showing the wire harness according to an embodiment.

As shown in FIG. 3, the covering member 70 is formed in a sheet shape having a slit 71 extending along the length direction of the wires 20, for example. For example, the covering member 70 is formed so as to have a tubular shape by rolling up a single flexible resin sheet in the circumferential direction. For example, the covering member 70 includes a first end 72 in a first direction (the circumferential direction of the wires 20 in FIG. 3) intersecting the length direction of the wires 20, and a second end 73 located opposite to the first end 72 in the first direction. For example, the covering member 70 is formed so as to have a tubular shape by overlapping the first end 72 and the second end 73 each other in the radial direction of the wires 20. For example, the inner circumferential dimension of the covering member 70 can be adjusted to a dimension suited to the outer circumferential dimensions of the plurality of wires 20 and the electromagnetic shielding member 25 by adjusting the overlap width between the first end 72 and the second end 73. For example, the covering member 70 has elasticity capable of returning from a tube state in which the covering member 70 can surround the outer circumferences of the wires 20 to a sheet state in which it does not surround the outer circumferences of the wires 20.

A non-conductive resin material can be used as the material of the covering member 70. As the resin material, it is possible to use, for example, a synthetic resin such as polyethylene terephthalate, polyolefin, polyamide, polyester, and an ABS resin. As the covering member 70, it is possible to use a twist tube, for example. The twist tube is formed of a woven fabric made of polyethylene terephthalate or polyester, for example. For example, the twist tube is formed by braiding resin fibers, and has meshes.

As shown in FIG. 2, the wire harness 10 includes, for example, an electromagnetic wave absorption member 80 provided at a portion of the wires 20 in the length direction, a fixing member 90 that fixes the electromagnetic wave absorption member 80 to the wires 20, and a movement restriction member 100 (movement restrictor) provided adjacent to the electromagnetic wave absorption member 80. For example, the wire harness 10 includes a dampening member 110 that covers the electromagnetic wave absorption member 80, and a clamp 140 that fixes the plurality of wires 20 to the vehicle body.

Configuration of Electromagnetic Wave Absorption Member 80

For example, the electromagnetic wave absorption member 80 is provided so as to collectively surround the outer circumferences of the plurality of wires 20. For example, the electromagnetic wave absorption member 80 is provided so as to surround the outer circumference of the electromagnetic shielding member 25 throughout the circumferential direction. For example, the electromagnetic wave absorption member 80 is provided so as to surround the outer circumference of the covering member 70 throughout the circumferential direction. For example, the electromagnetic wave absorption member 80 absorbs a portion of the electromagnetic waves (electromagnetic noise) emitted from the wires 20.

The electromagnetic wave absorption member 80 is provided between the grommet 50 and the connector C1, for example. For example, the electromagnetic wave absorption member 80 is provided between the tube portion 53 of the grommet 50 that is disposed in the vehicle interior, which is the non-waterproof region, and the connector C1 disposed in the vehicle interior. That is, the electromagnetic wave absorption member 80 of the present embodiment is provided in the vehicle interior, which is the non-waterproof region.

For example, in the length direction of the wires 20, the grommet 50 is provided on one side of the electromagnetic wave absorption member 80, and the connector C1 is provided on the other side of the electromagnetic wave absorption member 80. The electromagnetic wave absorption member 80 is provided spaced from the grommet 50 in the length direction of the wires 20, for example. The electromagnetic wave absorption member 80 is provided spaced from the connector C1 in the length direction of the wires 20, for example.

The electromagnetic wave absorption member 80 includes a through hole 81 through which the plurality of wires 20 collectively pass, for example. For example, the electromagnetic wave absorption member 80 has a ring shape by having the through hole 81. For example, the through hole 81 is formed so as to extend through the electromagnetic wave absorption member 80 in the length direction of the wires 20. For example, the plurality of wires 20 are provided so as to pass through the through hole 81.

The electromagnetic shielding member 25 is provided so as to pass through the through hole 81 in a state in which the electromagnetic shielding member 25 collectively surrounds the outer circumferences of the plurality of wires 20. For example, the covering member 70 is provided so as to pass through the through hole 81 in a state in which the cover member 70 surrounds the outer circumferences of the plurality of wires 20 and the electromagnetic shielding member 25.

Here, "ring" as used herein includes circular rings having a circular outer edge, rings having an ellipsoidal or oblong outer edge, polygonal rings having a polygonal outer edge, and rings having a rounded-corner polygonal outer edge, and refers to a shape constituted by any closed shape having an outer edge shape connected with a straight line or a curved line. The "ring" is a shape having a through hole in a plan view, and includes rings in which the outer edge shape and the inner circumferential shape of the through hole are the same, and rings in which the outer edge shape and the inner circumferential shape of the through hole are different. The "ring" includes rings having a predetermined length extending along the through direction of the through hole, and there is no limitation with respect to the size of the length. In addition, "ring shape" as used herein may be any shape that can be regarded as a ring as a whole, and includes ring shapes having a cut-out portion or the like in its part, such as a C-shape. For example, the electromagnetic wave absorption member 80 has a through hole 81 in a plan view as seen from the length direction of the wires 20, and is formed in a ring shape having a predetermined length extending along the through direction of the through hole 81.

The electromagnetic wave absorption member 80 of the present embodiment is formed only of a magnetic substance core 82 having a ring shape. The magnetic substance core 82 of the present embodiment is formed in a circular ring shape. For example, the magnetic substance core 82 is disposed so as to oppose the wires 20 throughout the circumferential direction of the wires 20, thereby having the function of reducing the electromagnetic waves emitted from the wires 20. For example, the magnetic substance core 82 absorbs the electromagnetic waves emitted from the wires 20, and converts the energy of the electromagnetic waves into mechanical energy such as vibration, or thermal energy. This reduces the adverse effects exerted on devices or the like in the surroundings by the electromagnetic waves emitted from the wires 20.

Here, "oppose" as used herein refers to that surfaces or members are located in front of each other, and includes not only a case where they are located fully in front of each other, but also a case where they are located partially in front of each other. In addition, "oppose" as used herein includes both a case where two portions oppose with a portion other than the two portions interposed therebetween, and a case where two portions oppose with nothing interposed therebetween.

The magnetic substance core 82 is a molded body containing a soft magnetic material, for example. Examples of the soft magnetic material include iron (Fe), iron alloys, and ferrites. Examples of the iron alloys include an Fe-silicon (Si) alloy and an Fe-nickel (Ni) alloy. As the magnetic substance core 82, it is possible to use, for example, a ferrite core, an amorphous core, or a permalloy core. The ferrite core is made of a soft ferrite that exhibits soft magnetism, for example. Examples of the soft ferrite include a ferrite containing nickel (Ni) and zinc (Zn), and a ferrite containing manganese (Mn) and zinc (Zn). The material of the magnetic substance core 82 can be selected as appropriate according to the frequency band of the electromagnetic noise that is to be reduced, for example.

As shown in FIG. 3, the magnetic substance core 82 of the present embodiment is formed continuously throughout the circumferential direction, and is formed in a closed ring shape. That is, a slit extending along the length direction of the wires 20 is not formed in the magnetic substance core 82 of the present embodiment. The magnetic substance core 82 of the present embodiment is formed by one component. Although the magnetic substance core 82 is formed by one component in the present embodiment, it is possible to form a magnetic substance core 82 having a ring shape formed by combining a plurality of core materials. For example, the magnetic substance core 82 may be formed in a circular ring shape by combining a pair of core materials each having a semicircular transverse cross section.

As shown in FIG. 2, the magnetic substance core 82 includes, for example, an outer circumferential surface 82A extending in the circumferential direction, a side surface 82B extending along the radial direction and facing the connector C1 side, and a side surface 82C extending in the radial direction and facing the corrugated tube 40 side. The side surfaces 82B and 82C are provided between the outer circumferential surface 82A and the inner circumferential surface of the through hole 81. The outer circumferential dimension of the magnetic substance core 82 is set to be larger than the outer circumferential dimension of the corrugated tube 40, for example. Accordingly, the outer circumferential surface 82A of the magnetic substance core 82 is provided at a position protruding radially outward of the outer circumferential surface of the corrugated tube 40.

Configuration of Fixing Member 90

The fixing member 90 is provided so as to fix the electromagnetic wave absorption member 80 to the plurality of wires 20, for example. The fixing member 90 is provided so as to fix the electromagnetic wave absorption member 80 to the covering member 70, for example. The fixing member 90 has the function of restricting movement of the electromagnetic wave absorption member 80 in the length direction of the wires 20, for example.

For example, the fixing member 90 is formed by one tape member 91 (tape) wrapped around the electromagnetic wave absorption member 80 and the covering member 70. For example, the tape member 91 includes an adhesive layer on one surface thereof. For example, the tape member 91 is wrapped around the electromagnetic wave absorption member 80 and the covering member 70 in a state in which the adhesive layer faces radially inward. For example, the tape member 91 is wrapped around, from the outer circumferential surface 82A of the electromagnetic wave absorption member 80 to the outer circumferential surface of the covering member 70. For example, the tape member 91 covers the outer circumferential surface 82A of the electromagnetic wave absorption member 80, and also covers the outer circumferential surface of the covering member 70. For example, the tape member 91 covers the outer circumferential surface 82A of the electromagnetic wave absorption member 80 so as to fasten the outer circumferential surface 82A radially inward, and also covers the outer circumferential surface of the covering member 70 so as to fasten the outer circumferential surface radially inward. The electromagnetic wave absorption member 80 is fixed to the covering member 70 by being fastened radially inward by the tape member 91, for example.

The tape member 91 is continuously wrapped around a region extending from the outer circumferential surface 82A of the magnetic substance core 82 to the outer circumferential surface of the covering member 70. Although not shown, the tape member 91 has an overlap wrapping structure, for example. Here, the overlap wrapping structure is a structure in which the tape member 91 is spirally wrapped such that predetermined portions of the tape member 91 in the width direction overlap each other. The overlap wrapping structure is preferably a half-overlap wrapping structure, for example. Here, the half-overlap wrapping structure is a structure in which the tape member 91 is spirally wrapped such that portions corresponding to substantially halves of the tape member 91 in the width direction overlap each other.

For example, the tape member 91 is wrapped around the outer circumferential surface 82A of the electromagnetic wave absorption member 80 throughout the circumferential direction. For example, the tape member 91 is wrapped around the outer circumferential surface of the covering member 70 throughout the circumferential direction. For example, the tape member 91 has the function of maintaining the covering member 70 in the tube state, that is, preventing the covering member 70 from returning to the sheet state.

Configuration of Movement Restriction Member 100

The movement restriction member 100 is provided adjacent to the electromagnetic wave absorption member 80, and is provided so as to restrict movement of the electromagnetic wave absorption member 80 in the length direction of the wires 20. For example, the movement restriction member 100 is provided on only one side of the electromagnetic wave absorption member 80 in the length direction of the wires 20. The movement restriction member 100 is provided between the grommet 50 and the electromagnetic wave absorption member 80, for example. For example, the movement restriction member 100 is provided between the tube portion 53 of the grommet 50 that is disposed in the vehicle interior, which is the non-waterproof region, and the electromagnetic wave absorption member 80.

The movement restriction member 100 is provided on the outer circumferences of the plurality of wires 20, for example. For example, the movement restriction member 100 is provided on the outer circumference of the covering member 70 that collectively covers the plurality of wires 20. The movement restriction member 100 is provided so as to surround the outer circumference of the covering member 70 throughout the circumferential direction, for example. The movement restriction member 100 is provided so as to fasten the outer circumference of the covering member 70 radially inward, for example. For example, the movement restriction member 100 has the function of maintaining the covering member 70 in the tube state, that is, preventing the covering member 70 from returning to the sheet state.

Figure 4:
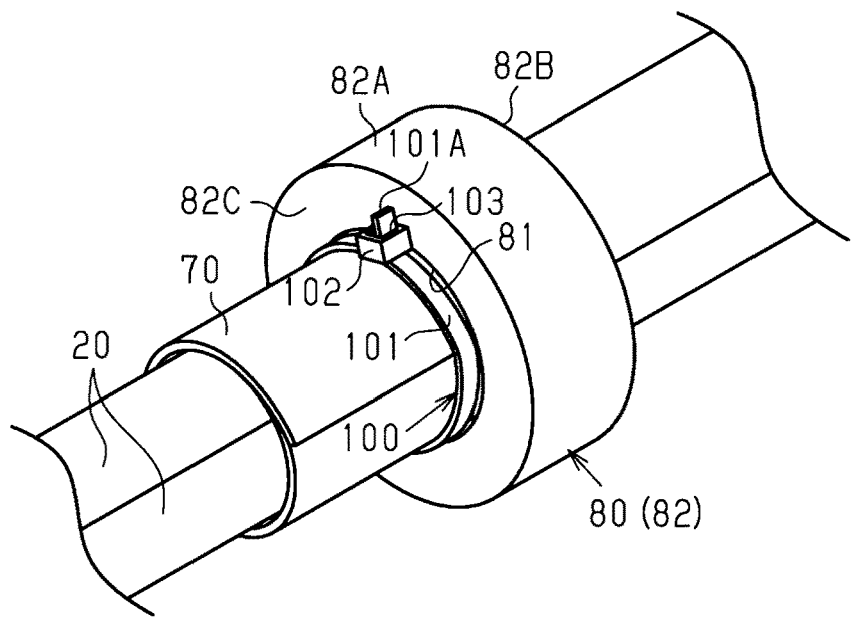
FIG. 4 is a schematic perspective view showing the wire harness according to an embodiment.

As shown in FIG. 4, the movement restriction member 100 of the present embodiment is a cable tie made of a synthetic resin. The movement restriction member 100 includes a long band-shaped portion 101, and a lock portion 102 that is formed as a single piece with the band-shaped portion 101 at a proximal end of the band-shaped portion 101 in the length direction thereof. As the material of the movement restriction member 100, it is possible to use, for example, polypropylene, polyether ether ketone, or a fluororesin.

The lock portion 102 is formed to have a larger cross-sectional configuration than that of the band-shaped portion 101, for example. For example, the lock portion 102 is formed so as to protrude outward from the outer circumferential surface of the band-shaped portion 101. The lock portion 102 is formed so as to protrude radially outward from the outer circumferential surface of the band-shaped portion 101, for example. The lock portion 102 is formed in a rectangular parallelepiped shape, for example. The lock portion 102 includes an insertion opening 103 into which the band-shaped portion 101 can be inserted, for example. For example, a locking pawl (not shown) is provided on the inner surface of the insertion opening 103. On the outer circumferential surface of a distal end 101A of the band-shaped portion 101 in the length direction, a plurality of locking grooves (not shown) extending along the width direction of the band-shaped portion 101 are formed at predetermined intervals in the length direction of the band-shaped portion 101, for example. In the movement restriction member 100 of the present embodiment, the band-shaped portion 101 is locked to the lock portion 102 by engaging the locking pawl of the lock portion 102 with one of the plurality of locking grooves formed in the band-shaped portion 101. With the movement restriction member 100, the degree of fastening of the covering member 70 by the band-shaped portion 101 can be adjusted according to the degree of insertion of the band-shaped portion 101 into the lock portion 102, for example.

The band-shaped portion 101 of the movement restriction member 100 is wrapped on the outer side of the covering member 70 throughout the circumferential direction of the covering member 70 in a state in which the distal end 101A of the band-shaped portion 101 is inserted into the insertion opening 103 of the lock portion 102. The band-shaped portion 101 is wrapped so as to come into contact with the outer circumferential surface of the covering member 70, for example. At this time, the distal end 101A of the band-shaped portion 101 protrudes outward from the lock portion 102. For example, the distal end 101A of the band-shaped portion 101 protrudes radially outward from the lock portion 102.

The movement restriction member 100 is formed in a size that does not allow itself to be inserted into the through hole 81 of the electromagnetic wave absorption member 80. For example, the movement restriction member 100 is formed to have a size that does not allow the lock portion 102 to be inserted into the through hole 81. The lock portion 102 is provided so as to oppose the side surface 82C of the magnetic substance core 82, for example. For example, the lock portion 102 is in contact with the side surface 82C of the magnetic substance core 82. The distal end 101A protruding outward from the lock portion 102 is provided so as to oppose the side surface 82C of the magnetic substance core 82, for example.

For example, when attaching the electromagnetic wave absorption member 80 to the wires 20, it is possible to position the electromagnetic wave absorption member 80 in the length direction of the wires 20 by bringing the side surface 82C of the electromagnetic wave absorption member 80 into contact with the lock portion 102. For example, when passing the wires 20 through the through hole 81 of the magnetic substance core 82 from the ends of the wires 20 to which the connector C1 (see FIG. 2) is to be connected, it is possible to easily position the electromagnetic wave absorption member 80 using the movement restriction member 100.

Note that, in FIG. 4, the illustration of the electromagnetic shielding member 25 is omitted for simplicity of illustration.

Configuration of Dampening Member 110

As shown in FIG. 2, the dampening member 110 is provided so as to surround the outer circumference of the electromagnetic wave absorption member 80, for example.

For example, the dampening member 110 has a tubular shape so as to surround the outer circumference of the electromagnetic wave absorption member 80 throughout the circumferential direction. The dampening member 110 is provided so as to surround the outer circumference of the movement restriction member 100, for example. The dampening member 110 has a tubular shape so as to surround the outer circumference of the movement restriction member 100 throughout the circumferential direction, for example. For example, the dampening member 110 has a tubular shape whose opposite ends in the length direction of the wires 20 are open.

For example, the dampening member 110 is porous. As the material of the dampening member 110, it is possible to use, for example, a material having excellent shock absorbing properties and cushioning properties. As the material of the dampening member 110, it is possible to use, for example, a material that is superior in shock absorbing properties and cushioning properties to the corrugated tube 40 and the covering member 70. As the material of the dampening member 110, it is possible to use, for example, a material having excellent sound absorbing properties. As the material of the dampening member 110, it is possible to use, for example, a material that is superior in sound absorbing properties to the corrugated tube 40 and the covering member 70. As the material of the dampening member 110, it is possible to use, for example, a foamed resin. The cell structure in the foamed resin may be an open-cell structure or a closed-cell structure. As the material of the dampening member 110, it is possible to use, for example, foamed urethane, foamed polyethylene, a foamed ethylene-propylene-diene rubber, or the like.

The dampening member 110 is fixed to the outer circumference of the covering member 70 on both sides of the electromagnetic wave absorption member 80 in the length direction of the wires 20, for example. For example, one end of the dampening member 110 in the length direction is fixed to the outer circumferential surface of the covering member 70 by a fixing member 120, and the other end thereof in the length direction is fixed to the outer circumferential surface of the covering member 70 by a fixing member 130. The dampening member 110 is formed so as to surround the electromagnetic wave absorption member 80, the fixing member 90, and the movement restriction member 100 throughout the circumferential direction, for example. That is, the electromagnetic wave absorption member 80, the fixing member 90, and the movement restriction member 100 are accommodated in the internal space of the dampening member 110.

As shown in FIG. 3, the dampening member 110 has a slit 111 extending along the length direction of the wires 20, for example. For example, the dampening member 110 is formed so as to have a tubular shape by rolling up a single flexible, porous sheet in the circumferential direction. For example, the dampening member 110 includes a first end 112 in a first direction (the circumferential direction of the wires 20 in FIG. 3) intersecting the length direction of the wires 20, and a second end 113 located opposite to the first end 112 in the first direction. For example, the dampening member 110 is formed so as to have a tubular shape by overlapping the first end 112 and the second end 113 each other in the radial direction of the electromagnetic wave absorption member 80. For example, the inner circumferential dimension of the dampening member 110 can be adjusted to a dimension suited to the outer circumferential dimension of the electromagnetic wave absorption member 80 by adjusting the overlap width between the first end 112 and the second end 113. For example, the dampening member 110 has elasticity capable of returning from a tube state in which the dampening member 110 can surround the outer circumference of the electromagnetic wave absorption member 80 to a sheet state in which it does not surround the outer circumference of the electromagnetic wave absorption member 80.

The dampening member 110 of the present embodiment does not have a bonding surface or an adhesive surface. For example, the dampening member 110 is maintained in the tube state by being fixed to the covering member 70 by the fixing members 120 and 130 shown in FIG. 2.

Configuration of Fixing Members 120 and 130

As shown in FIG. 2, the fixing members 120 and 130 are each formed so as to fix an end of the dampening member 110 in the length direction to the outer circumferential surface of the covering member 70, for example. As the fixing members 120 and 130, it is possible to use, for example, a tape member, a cable tie, a crimping band, or the like. The fixing members 120 and 130 of the present embodiment are tape members each having an adhesive layer on one surface thereof.

For example, the fixing member 120 is wrapped around, from the outer circumferential surface of an end on the grommet 50 side of the dampening member 110 in the length direction to the outer circumferential surface of the covering member 70 that is exposed from the dampening member 110. For example, the fixing member 120 is continuously wrapped around a region extending from the outer circumferential surface of the dampening member 110 to the outer circumferential surface of the covering member 70. The fixing member 120 has an overlap wrapping structure, for example. For example, the fixing member 120 has a half-overlap wrapping structure. For example, the fixing member 120 is wrapped around the outer circumference of the end of the dampening member 110 such that the tube state of the dampening member 110 is maintained.

For example, the fixing member 130 is wrapped around, from the outer circumferential surface of an end on the connector C1 side of the dampening member 110 in the length direction to the outer circumferential surface of the covering member 70 that is exposed from the dampening member 110. For example, the fixing member 130 is continuously wrapped around a region extending from the outer circumferential surface of the dampening member 110 to the outer circumferential surface of the covering member 70. The fixing member 130 has an overlap wrapping structure, for example. For example, the fixing member 130 has a half-overlap wrapping structure. For example, the fixing member 130 is wrapped around the outer circumference of the end of the dampening member 110 such that the tube state of the dampening member 110 is maintained.

Configuration of Clamp 140

The clamp 140 is provided on the outer circumference of the plurality of wires 20, for example. For example, the clamp 140 is attached to the outer circumferential surface of the covering member 70 that covers the plurality of wires 20. For example, the clamp 140 is provided so as to surround the outer circumferential surface of the covering member 70 throughout the circumferential direction. The clamp 140 is fixed to the vehicle body of the vehicle V (see FIG. 1) by a fixing portion (not shown), for example. As the material of the clamp 140, it is possible to use, for example, a resin material or a metal material. As the resin material, it is possible to use, for example, a conductive resin material or a non-conductive resin material. As the metal material, it is possible to use, for example, an iron-based or aluminum-based metal material.

The clamp 140 is provided between the electromagnetic wave absorption member 80 and the connector C1 in the length direction of the wires 20, for example. For example, the clamp 140 is provided at a position closer to the connector C1 than the dampening member 110. That is, the clamp 140 is provided on the outer circumferential surface of the covering member 70 that is located between the end on the connector C1 side of the dampening member 110 and the connector C1.

The electromagnetic wave absorption member 80 of the present embodiment is provided between the grommet 50 and the clamp 140 in the length direction of the wires 20. Here, the grommet 50 is fixed to the vehicle body panel 200. The clamp 140 is fixed to the vehicle body by the fixing portion (not shown). Accordingly, the electromagnetic wave absorption member 80 is fixed to the vehicle body on both sides in the length direction of the wires 20.

Next, operations and effects of the present embodiment will be described.

(1) A wire harness 10 includes: a wire 20; an electromagnetic wave absorption member 80 that has a through hole 81 through which the wire 20 passes, and that is provided so as to surround an outer circumference of the wire 20; and a movement restriction member 100 that is provided adjacent to the electromagnetic wave absorption member 80, and that restricts movement of the electromagnetic wave absorption member 80 in the length direction of the wire 20.

With this configuration, the movement restriction member 100 is provided adjacent to the electromagnetic wave absorption member 80. With the movement restriction member 100, it is possible to suppress positional displacement of the electromagnetic wave absorption member 80 in the length direction of the wire 20.

(2) The movement restriction member 100 is provided on only one side of the electromagnetic wave absorption member 80 in the length direction of the wire 20. With this configuration, when attaching the electromagnetic wave absorption member 80 to the wire 20, for example, it is possible to restrict movement of the electromagnetic wave absorption member 80 in the length direction of the wire 20 by the movement restriction member 100. Accordingly, it is possible to easily position the electromagnetic wave absorption member 80 in the length direction of the wire 20. For example, when passing the wire 20 through the through hole 81 of the magnetic substance core 82 from an end of the wire 20 to which the connector C1 is to be connected, it is possible to easily position the electromagnetic wave absorption member 80 by bringing the side surface 82C of the magnetic substance core 82 into contact with the lock portion 102 of the movement restriction member 100. This can increase the ease of assembly of the wire harness 10.

(3) A covering member 70 that covers the outer circumference of the wire 20 is provided, and the wire 20 is passed through the through hole 81 of the electromagnetic wave absorption member 80 in a state in which the wire 20 is covered by the covering member 70. Accordingly, it is possible to prevent the inner circumferential surface of the through hole 81 from coming into direct contact with the outer circumferential surface of the wire 20. This can suitably prevent the wire 20 from being damaged due to contact with the inner circumferential surface of the through hole 81.

(4) The covering member 70 is formed so as to have a tubular shape that surrounds the outer circumference of the wire 20 throughout the circumferential direction thereof by overlapping the second end 73 of the sheet-shaped covering member 70 with the first end 72 thereof. Accordingly, the covering member 70 can be easily attached to the wire 20 at a later time. This can increase the ease of assembly of the wire harness 10.

(5) By forming the movement restriction member 100 so as to surround the outer circumference of the covering member 70 throughout the circumferential direction thereof, it is possible to maintain the tube state of the covering member 70 by the movement restriction member 100. This can suppress an increase in the number of components as compared with a case where the member for restricting movement of the electromagnetic wave absorption member 80 and the member for maintaining the tube state of the covering member 70 are provided separately.

(6) A tape member 91 that fixes the electromagnetic wave absorption member 80 to the covering member 70 is provided. With this configuration, it is possible to fix the electromagnetic wave absorption member 80 to the covering member 70. This can suitably suppress positional displacement of the electromagnetic wave absorption member 80 relative to the covering member 70.

(7) The tape member 91 is formed so as to cover the outer circumferential surface of the electromagnetic wave absorption member 80, and to cover the outer circumference of the covering member 70 throughout the circumferential direction. With this configuration, it is possible to maintain the tube state of the covering member 70 by the tape member 91. This can suppress an increase in the number of components as compared with a case where the member for fixing the electromagnetic wave absorption member 80 to the covering member 70 and the member for maintaining the tube state of the covering member 70 are provided separately.

(8) The movement restriction member 100 is formed by a cable tie including a band-shaped portion 101, and a lock portion 102 that is formed as a single piece with the band-shaped portion 101 at a proximal end of the band-shaped portion 101 in the length direction thereof, and that opposes a side surface 82C of the electromagnetic wave absorption member 80. With this configuration, it is possible to restrict movement of the electromagnetic wave absorption member 80 in the length direction of the wire 20 by bringing the side surface 82C of the electromagnetic wave absorption member 80 into contact with the lock portion 102 of the cable tie. In addition, with the cable tie, the band-shaped portion 101 can be easily wrapped around the outer circumferences of the wire 20, thus making it possible to increase the ease of assembly of the wire harness 10.

(9) A distal end 101A of the band-shaped portion 101 in the length direction is formed so as to protrude outward from the lock portion 102. The distal end 101A is formed so as to oppose the side surface 82C of the electromagnetic wave absorption member 80. With this configuration, the distal end 101A of the band-shaped portion 101 is formed so as to protrude outward from the lock portion 102, and thus the outer circumferential dimension of the movement restriction member 100 can be formed to be large. Accordingly, it is possible to suitably prevent the movement restriction member 100 from being passed through the through hole 81 of the electromagnetic wave absorption member 80. As a result, it is possible to suitably restrict movement of the electromagnetic wave absorption member 80 by the movement restriction member 100.

(10) The electromagnetic wave absorption member 80 and the movement restriction member 100 are provided between a connector C1 and a grommet 50 that is to be attached to a mounting hole 200X of a vehicle body panel 200 provided between a waterproof region that requires waterproofing and a non-waterproof region that does not require waterproofing. With this configuration, the electromagnetic wave absorption member 80 is disposed in the non-waterproof region. Therefore, the electromagnetic wave absorption member 80 and the surrounding region do not need to have a waterproof structure. Accordingly, any additional member for forming a waterproof structure does not need to be provided, thus making it possible to suppress an increase in the number of components.

(11) A vehicle body fixing clamp 140 is provided between the connector C1 and the electromagnetic wave absorption member 80 in the length direction of the wire 20. With this configuration, in the length direction of the wire 20, the grommet 50 that is to be attached to the vehicle body panel 200 is provided on one side of the electromagnetic wave absorption member 80, and the clamp 140 that is to be fixed to the vehicle body is provided on the other side of the electromagnetic wave absorption member 80. Accordingly, both sides of the electromagnetic wave absorption member 80 can be fixed to the vehicle body. This makes it possible to stably hold the electromagnetic wave absorption member 80.

(12) A porous dampening member 110 (porous damper) that covers the outer circumference of the electromagnetic wave absorption member 80 is provided. With this configuration, the outer circumference of the electromagnetic wave absorption member 80 is covered by the porous dampening member 110, and therefore the dampening member 110 can be interposed between the electromagnetic wave absorption member 80 and the surrounding components. This can inhibit the generation of unusual sound due to contact between the electromagnetic wave absorption member 80 and the surrounding components.

(13) The dampening member 110 is provided so as to cover the outer circumference of the movement restriction member 100. With this configuration, the outer circumference of the movement restriction member 100 is covered by the porous dampening member 110, and therefore the dampening member 110 can be interposed between the movement restriction member 100 and the surrounding components. This can inhibit the generation of unusual sound due to contact between the movement restriction member 100 and the surrounding components.

Other Embodiments

The above embodiment can be implemented with the following modifications. The above embodiment and the following modifications can be implemented in combination with each other as long as there are no technical discrepancies.

In the above embodiment, the movement restriction member 100 is implemented as a cable tie made of a synthetic resin. However, the present disclosure is not limited thereto. For example, the movement restriction member 100 may be formed by a cable tie made of a metal.

In the above embodiment, the movement restriction member 100 is implemented as a cable tie. However, the present disclosure is not limited thereto. For example, the movement restriction member 100 may be implemented as a tape member. For example, the movement restriction member 100 may be formed by repeatedly wrapping a tape member around the outer circumferential surface of the covering member 70 to a predetermined thickness. Alternatively, the movement restriction member 100 may be formed by a crimping ring or a clamp, for example.

In the above embodiment, the movement restriction member 100 is formed so as to surround the outer circumference of the covering member 70 throughout the circumferential direction. However, the present disclosure is not limited thereto. For example, the movement restriction member 100 may be provided at only a portion of the outer circumference of the covering member 70 in the circumferential direction.

In the above embodiment, the movement restriction member 100 is provided on only one side of the electromagnetic wave absorption member 80 in the length direction of the wire 20. However, the present disclosure is not limited thereto. For example, the movement restriction member 100 may be provided on both sides of the electromagnetic wave absorption member 80 in the length direction of the wire 20.

A bonding layer or an adhesive layer may be provided on one surface of the dampening member 110 of the above embodiment. For example, a bonding layer or an adhesive layer may be provided on one surface of the second end 113 of the dampening member 110. With this configuration, the second end 113 can be bonded to the first end 112 when the second end 113 is overlapped with the first end 112 of the dampening member 110. This can suitably prevent the dampening member 110 from returning to the sheet state in a stage before the dampening member 110 is fixed by the fixing members 120 and 130.

In the above embodiment, the dampening member 110 is implemented as a structure having a sheet shape that has a slit 111 extending in the length direction of the wire 20. However, the present disclosure is not limited thereto.

Figure 5:
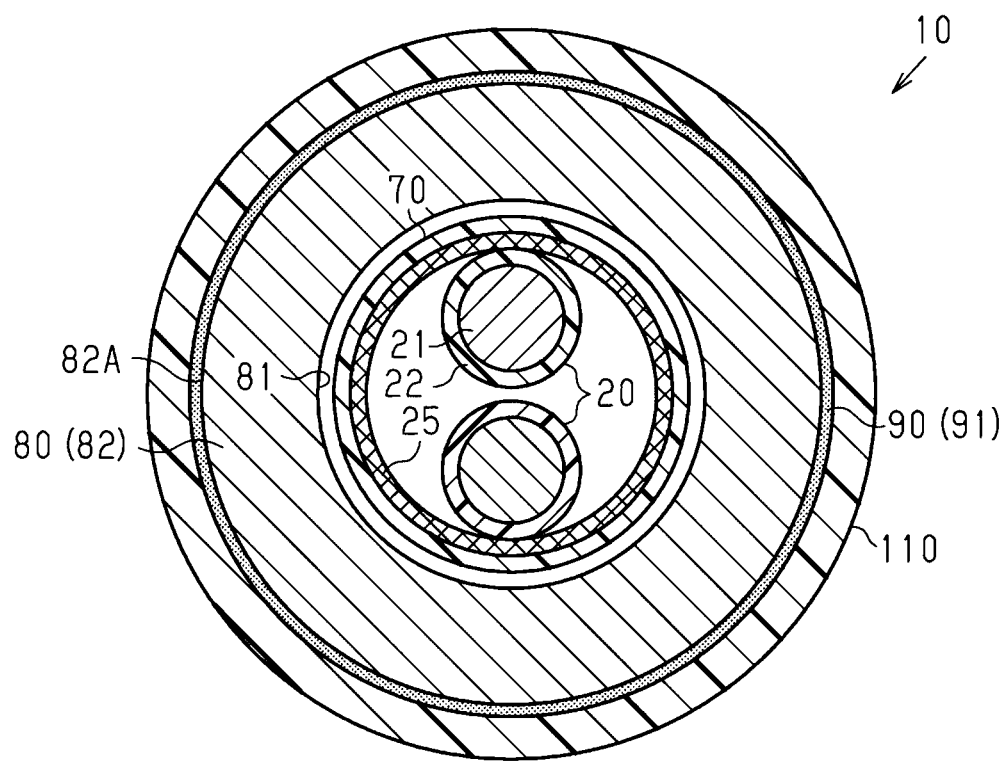
FIG. 5 is a schematic transverse sectional view showing a wire harness according to a modification.

For example, as shown in FIG. 5, the dampening member 110 may be implemented as a structure having a tubular shape that does not have a slit extending in the length direction of the wire 20. The dampening member 110 of this modification is formed so as to surround the outer circumference of the electromagnetic wave absorption member 80 throughout the circumferential direction. For example, the dampening member 110 of this modification has been already formed as a tube in a state before the electromagnetic wave absorption member 80 is disposed thereinside.

In the above embodiment, the covering member 70 is implemented as a structure having a slit 71 extending in the length direction of the wire 20. However, the present disclosure is not limited thereto.

For example, as shown in FIG. 5, the covering member 70 may be implemented as a structure having a tubular shape that does not have a slit extending in the length direction of the wires 20. The covering member 70 of this modification is formed so as to surround the outer circumferences of a plurality of wires 20 throughout the circumferential direction. For example, the covering member 70 of this modification has been already formed as a tube in a state before the wires 20 are disposed thereinside.

In the above embodiment, the covering member 70 is implemented as a twist tube. However, the present disclosure is not limited thereto. There is no particular limitation with respect to the covering member 70, as long as it is an exterior member that can cover the outer circumferences of the wire 20, and may be formed by a corrugated tube, for example. In this case, the corrugated tube may have a slit extending along the length direction of the wire 20, or may not have a slit.

The covering member 70 in the above embodiment may be omitted.

The electromagnetic shielding member 25 in the above embodiment may be omitted.

The wire 20 in the above embodiment may be changed to a shielded wire.

In the above embodiment, the electromagnetic wave absorption member 80 is formed only by the magnetic substance core 82. However, the present disclosure is not limited thereto. For example, the electromagnetic wave absorption member 80 may have a configuration including a magnetic substance core 82 and a case that accommodates the magnetic substance core 82.

There is no particular limitation with respect to the number of electromagnetic wave absorption members 80 and the installation position thereof in the above embodiment. For example, the wire harness 10 may be provided with two or more electromagnetic wave absorption members 80. For example, the electromagnetic wave absorption member 80 may be provided in the vehicle exterior, which is the waterproof region.

In the above embodiment, the fixing member 90 is formed by the tape member 91. However, the present disclosure is not limited thereto. For example, it is possible to use a metal band or a cable tie made of a resin as the fixing member 90.

In the above embodiment, two wires 20 are accommodated inside the exterior member 30. However, the present disclosure is not particularly limited thereto, and the number of wires 20 can be changed according to the specifications of the vehicle V. For example, one, or three or more wires 20 may be accommodated inside the exterior member 30. For example, a low-voltage wire that connects a low-voltage battery to various low-voltage devices (a lamp, a car audio system, etc.) may be additionally provided as a wire accommodated in the exterior member 30.

The arrangement relationship between the inverter 11 and the high-voltage battery 12 in the vehicle V is not limited to that described in the above embodiment, and may be changed as appropriate according to the vehicle configuration.

Figure 6:
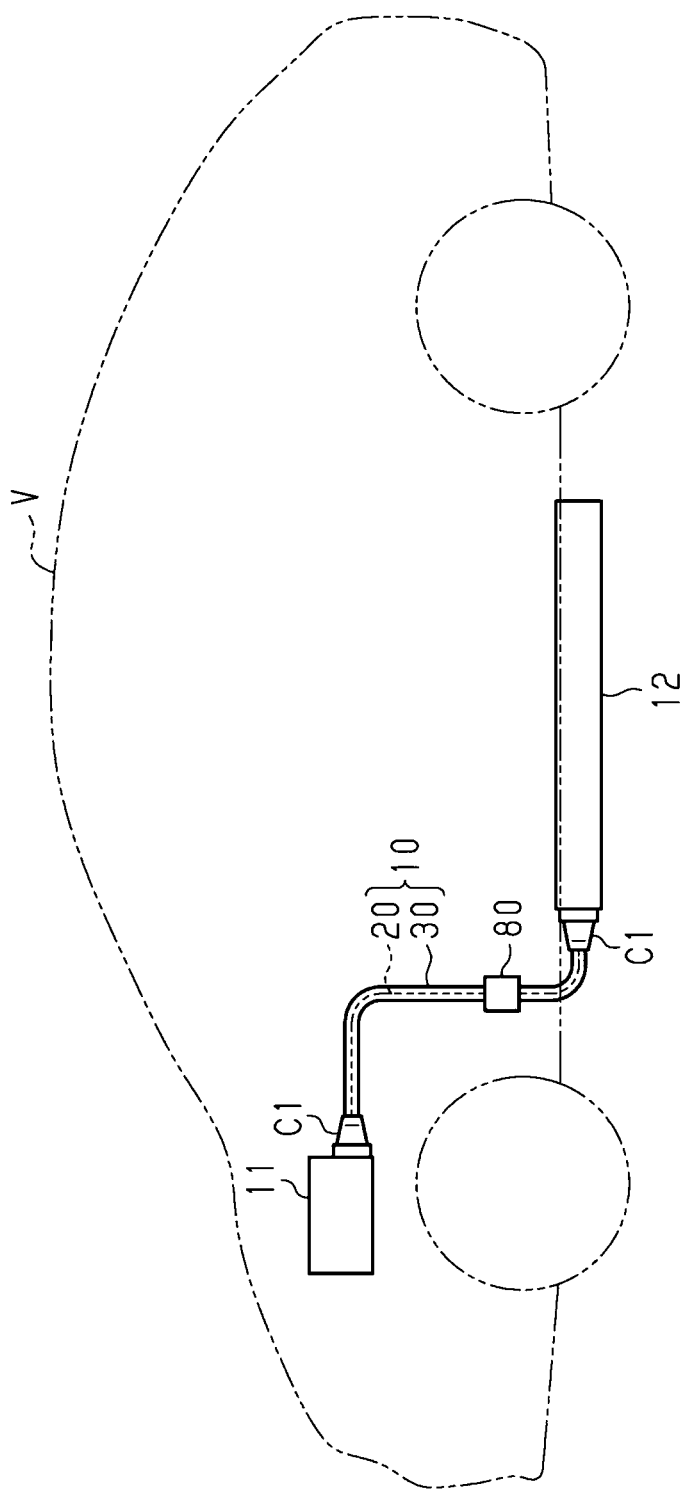
FIG. 6 is a schematic configuration diagram showing a wire harness according to a modification.

For example, as shown in FIG. 6, a high-voltage battery 12 may be disposed on substantially the entire floor of the vehicle V, and the wire harness 10 is implemented so as to electrically connect the high-voltage battery 12 to the inverter 11.

In the above embodiment, the inverter 11 and the high-voltage battery 12 are used as electric devices that are connected by the wire harness 10. However, the present disclosure is not limited thereto. For example, the wire harness 10 may be used for a wire that connects the inverter 11 to a wheel driving motor. That is, the present disclosure is applicable to any component that establishes an electrical connection between electric devices that are mounted in the vehicle V.

It should be appreciated that the embodiments disclosed herein are to be construed in all respects as illustrative and not limiting. The scope of the present disclosure is defined by the claims, rather than the description of the embodiment above, and is intended to include all modifications which fall within the scope of the claims and the meaning and scope of equivalents thereof.

What is claimed is:

1. A wire harness comprising:
a wire;
an electromagnetic wave absorber that has a through hole through which the wire passes, and that is provided so as to surround an outer circumference of the wire; and
a movement restrictor that is provided adjacent to the electromagnetic wave absorber, and that restricts movement of the electromagnetic wave absorber in a length direction of the wire;
a cover that covers the outer circumference of the wire, wherein
the cover passes through the through hole in a state in which the cover covers the outer circumference of the wire,
the cover is formed in a sheet shape having a slit extending along the length direction of the wire,
the cover includes a first end in a first direction intersecting the length direction of the wire, and a second end provided opposite to the first end of the cover in the first direction,
the cover is formed so as to have a tubular shape that surrounds the outer circumference of the wire throughout a circumferential direction of the wire by overlapping the second end of the cover with the first end of the cover, and
the movement restrictor is provided so as to surround an outer circumference of the cover throughout a circumferential direction of the cover; and
a porous damper that covers an outer circumference of the electromagnetic wave absorber, wherein
the damper is formed in a sheet shape having a slit extending along the length direction of the wire,
the damper includes a first end in the first direction intersecting the length direction of the wire, and a second end provided opposite to the first end of the damper in the first direction,
the damper is formed so as to have a tubular shape that surrounds the outer circumference of the wire throughout the circumferential direction of the wire by overlapping the second end of the damper with the first end of the damper, and
the damper is provided so as to cover the outer circumference of the movement restrictor.

2. The wire harness according to claim 1, wherein the movement restrictor is provided on only one side of the electromagnetic wave absorber in the length direction of the wire.

3. The wire harness according to claim 1, further comprising:
a tape that fixes the electromagnetic wave absorber to the cover,
wherein the tape covers the outer circumference of the electromagnetic wave absorber, and covers the outer circumference of the cover throughout the circumferential direction of the cover.

4. The wire harness according to claim 1, wherein the movement restrictor is a cable tie including a band-shaped portion, and a lock portion that is formed as a single piece with the band-shaped portion, the lock portion being formed at a proximal end of the band-shaped portion in a length direction of the band-shaped portion, and
the lock portion opposes a side surface of the electromagnetic wave absorber.

5. The wire harness according to claim 4, wherein a distal end of the band-shaped portion in the length direction of the band-shaped portion protrudes outward from the lock portion, and the distal end opposes the side surface of the electromagnetic wave absorber.

6. The wire harness according to claim 1, further comprising:
- a grommet that is to be attached to a mounting hole of a vehicle body panel provided between a waterproof region that requires waterproofing and a non-waterproof region that does not require waterproofing; and
- a connector that is connected to an end of the wire, wherein
  - the connector is provided in the non-waterproof region,
  - the electromagnetic wave absorber is provided between the grommet and the connector in the length direction of the wire, and
  - the movement restrictor is provided between the grommet and the electromagnetic wave absorber in the length direction of the wire.

7. The wire harness according to claim 6, further comprising:
- a vehicle body fixing clamp provided between the connector and the electromagnetic wave absorber in the length direction of the wire.

\* \* \* \* \*